United States Patent [19]

Suzuki et al.

[11] Patent Number: 4,502,129
[45] Date of Patent: Feb. 26, 1985

[54] MAGNETIC BUBBLE DETECTOR

[75] Inventors: Ryo Suzuki, Kodaira; Minoru Hiroshima, Hachioji; Masatoshi Takeshita, Tokorozawa; Yutaka Sugita, Mobara, all of Japan

[73] Assignee: Hitachi, Ltd., Tokyo, Japan

[21] Appl. No.: 505,486

[22] Filed: Jun. 17, 1983

[30] Foreign Application Priority Data

Jun. 18, 1982 [JP] Japan ................................. 57-103825

[51] Int. Cl.³ ............................................ G11C 19/08
[52] U.S. Cl. ........................................................ 365/8
[58] Field of Search ........................................ 365/8, 1

[56] References Cited

U.S. PATENT DOCUMENTS 4,349,892 9/1982 Suzuki et al. ............................ 365/8

FOREIGN PATENT DOCUMENTS 58-17592 2/1983 Japan ....................................... 365/1
625245 8/1978 U.S.S.R. .................................. 365/8

Primary Examiner—James W. Moffitt
Attorney, Agent, or Firm—Antonelli, Terry & Wands

[57] ABSTRACT

A magnetic bubble detector has a stretcher part for stretching a magnetic bubble while propagating it and a detection part for detecting the magnetic bubble while propagating it. In the magnetic bubble detector, the period of arrangement of bubble propagation elements forming the exit of the stretcher part viewed in a bubble propagation direction is larger than the period of arrangement of bubble propagation elements forming the entrance of the stretcher part viewed in a bubble propagation direction.

7 Claims, 7 Drawing Figures

MAGNETIC BUBBLE DETECTOR

BACKGROUND OF THE INVENTION

The present invention relates to a thick-film bubble detector having both a function of propagating magnetic bubbles and a function of detecting them.

A magnetic bubble device is required to have a bubble detector for detecting the presence or absence of a magnetic bubble in the form of an electric signal. In a magnetic bubble device using magnetic bubble propagation elements made of a soft magnetic material such as permalloy (namely, a nickel-iron alloy), a single soft-magnetic layer can be used to propagate magnetic bubbles and to detect them, that is, the so-called thick-film bubble detector can be used. This detector is formed of the soft-magnetic layer having a chevron pattern or modified chevron pattern. Further, in a detection part of the detector, a plurality of bubble propagation elements each having the form of a chevron are electrically connected in series, and supplied with a constant current. When a magnetic bubble is propagated to the detector, it is first elongated (or stretched) in lateral directions perpendicular to a bubble propagation direction. When the magnetic bubble thus stretched passes through the detection part of the detector, the soft magnetic material forming the detection part is changed in the state of magnetization, and therefore the electric resistance of the above soft magnetic material is varied on the basis of the magnetoresistance effect. The resistance change at the detection part is detected in the form of a voltage change, since the constant current flows through the detection part. Thus, the magnetic bubble can be detected by the detection part. The magnetic bubble thus detected is sent to the outside of an effective region of the device, to be erased. Accordingly, the bubble detector is divided into three main parts, that is, a stretcher part for stretching a magnetic bubble, a detection part for electrically detecting the magnetic bubble, and a send-out part for sending out the magnetic bubble to the outside of an effective region. In order to gradually stretch the magnetic bubble, the stretcher part has the form of a triangle (or sector), that is, the width of the stretcher part is smallest at the entrance thereof, and increases as the distance from the entrance becomes larger.

In conventional bubble detectors, the stretcher, detection and send-out parts are made equal to each other in the period of arrangement of bubble propagation elements forming each part viewed in a bubble propagation direction (hereinafter simply referred to as "the period of the bubble propagation element"), or the stretcher part is made equal to the send-out part but different from the detection part in the period of the bubble propagation element. In either case, the period of the bubble propagation element is kept constant in the stretcher part.

In the case where magnetic bubbles having a small diameter are used, the period of the bubble propagation element at the stretcher part is usually made larger than the period of the arrangement of fundamental bubble propagation elements forming a minor loop or others viewed in a bubble propagation direction, to generate a strong magnetic pole at the stretcher part by making large the period of the bubble propagation element at the stretcher part, thereby enhancing the bubble stretching capacity of the stretcher part. Further, it is also desirable from another point of view to make large the period of the propagation element at the stretcher. That is, the detection part judges the presence or absence of the magnetic bubble on the basis of leakage flux from magnetic bubbles, and therefore a detection signal outputted from the detection part is affected not only by the leakage flux from a magnetic bubble to be detected, but also by the leakage flux from magnetic bubbles proximate to the to-be-detected magnetic bubble. Accordingly, the detection signal varies with the distribution of magnetic bubbles (that is, the state of data) in the vicinity of the detection part. This makes it difficult to judge the presence or absence of magnetic bubble. The influence of the magnetic bubbles proximate to the to-be-detected magnetic bubble on the detection signal can be reduced by making large the distance between adjacent magnetic bubbles in the bubble propagation direction, that is, the period of the bubble propagation element. For these reasons, the period of the propagation element has hitherto been made large everywhere at the stretcher part.

As mentioned above, in order to enhance the margin of stretching bubbles at the stretcher part and to reduce the influence of magnetic bubbles proximate to a to-be-detected magnetic bubble on the detector part, it is desirable to make the period of the propagation element large at the stretcher part. However, in the case where the period of the propagation element is made large at the entrance portion (namely, sector portion) of the stretcher part, a malfunction that a stretching magnetic bubble is not propagated partly, is performed when a bias magnetic field is low, and therefore the bubble propagation margin of the stretcher part is reduced, that is, the range of bias magnetic field in which a magnetic bubble is normally propagated, is narrowed.

SUMMARY OF THE INVENTION

It is accordingly an object of the present invention to provide a bubble detector for magnetic bubble devices which is provided with a stretcher part having a large bubble propagation margin and which can reduce the leakage flux of the magnetic bubbles existing in the neighborhood of a detection part to the detection part, to solve the above-mentioned problem of the prior art.

In order to attain the above object, according to the present invention, there is provided a magnetic bubble detector which includes a stretcher part for stretching a magnetic bubble while propagating it and a detection part for detecting a magnetic bubble while propagating it, and in which the period of the bubble propagation element at the entrance of the stretcher part is shorter than the period of the bubble propagation element at the exit of the stretcher part.

As mentioned previously, in the case where the period of the bubble propagation element is made large everywhere at the stretcher part, there arises the problem that a stretching magnetic bubble is not propagated normally. Accordingly, in accordance with the present invention, the period of the bubble propagation element at the portion of the stretcher part which is proximate to the detection part is made larger than the period of bubble propagation element at the entrance of the stretcher part in order to improve the bubble propagation characteristic of the stretcher part and to reduce the influence of magnetic bubbles proximate to a to-be-detected magnetic bubble on the detection part.

The period of the bubble propagation element at the detection part may be made larger than that at the entrance of the stretcher part, since such an arrangement of bubble propagation elements is effective to reduce the influence of magnetic bubbles proximate to a to-be-detected magnetic bubble on the detection part.

The period of the bubble propagation element at that portion of the stretcher part which is proximate to the detection part, is made larger than the period of bubble propagation at the entrance of the stretcher part, in such a manner that the period of the bubble propagation element is increased continuously or stepwise between the entrance and exit of the stretcher part. In short, it is important that the period of the bubble propagation element at the stretcher part has a tendency to increase in the direction from the entrance of the stretcher part to the exit thereof.

DESCRIPTION OF THE PREFERRED EMBODIMENTS

Prior to explanation of embodiments of the present invention, a conventional magnetic bubble detector and an improvement therein according to the present invention will be explained with reference to FIGS. 1 to 4.

Figure 1:
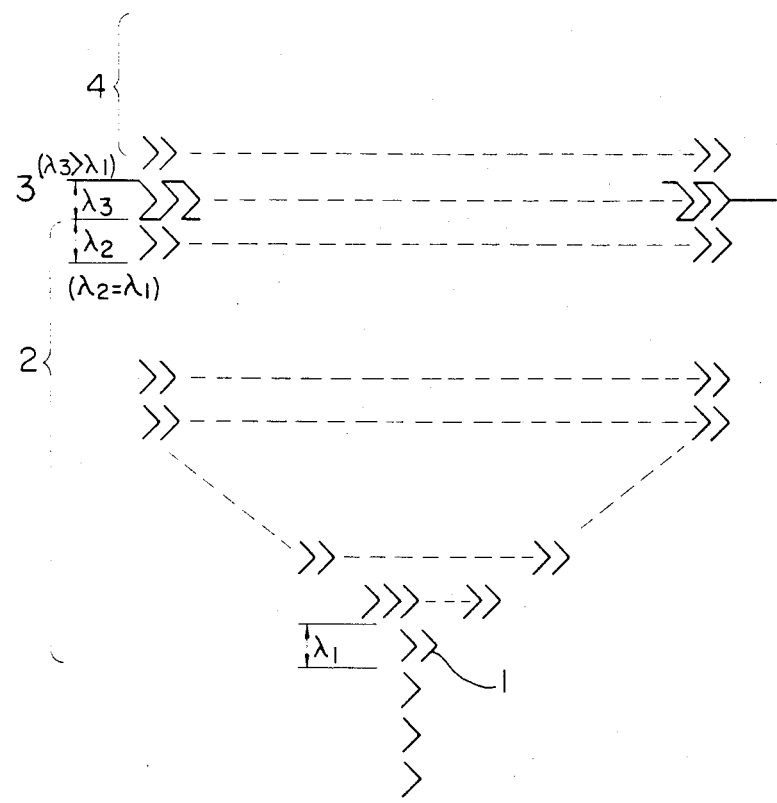
FIG. 1 is a schematic view showing the structure of a conventional thick-film bubble detector.
Figure 2:
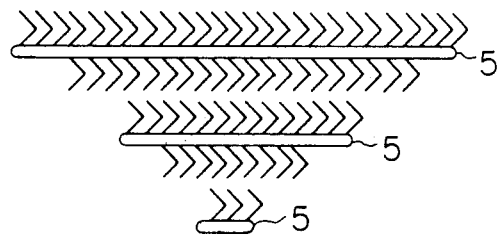
FIG. 2 is a schematic view showing that a magnetic bubble is stretched at the stretcher part of the detector shown in FIG. 1.

FIG. 1 shows the structure of a thick-film bubble detector which is formed of the same soft magnetic layer as used to propagate magnetic bubbles. In FIG. 1, reference numeral 1 designates a bubble propagation element having the form of a chevron, 2 a stretcher part of the detector, 3 a detection part of the detector, and 4 a send-out part of the detector. FIG. 2 shows how a magnetic bubble is stretched at the stretcher part 2 shown in FIG. 1. Reference numeral 5 in FIG. 2 designates a magnetic bubble. Further, in FIG. 1, reference symbols $\lambda_1$, $\lambda_2$ and $\lambda_3$ designate the period of the bubble propagation element at the entrance of the stretcher part, the period of the bubble propagation element at that portion of the stretcher part which is proximate to the detection part, and the period of the bubble propagation element at the detection part, respectively. As shown in FIG. 1, the entrance of the stretcher part 2 has the form of a sector so that a magnetic bubble to be detected is gradually stretched. Further, at the detection part 3, a plurality of bubble propagation elements each having the form of a chevron are electrically connected with each other, and are supplied with a constant current from a constant current source (not shown). A magnetic bubble having reached the detector is gradually stretched in the lateral direction at the stretcher part 2, as shown in FIG. 2. When the magnetic bubble thus stretched passes through the detection part 3, the state of magnetization of the soft magnetic material forming the detection part 3 is changed, and such a change of the state of magnetization causes a change in the resistance of the above soft magnetic material by the magnetoresistance effect. The resistance change is detected in the form of a voltage change. Thus, the presence of a magnetic bubble can be detected on the basis of the voltage change.

In the conventional bubble detector, the period of the bubble propagation element is kept constant in the stretcher part 2. That is, the period $\lambda_1$ is equal to the period $\lambda_2$. Further, the period $\lambda_1$ ($=\lambda_2$) of bubble propagation element at the stretcher part is made large, to generate a strong magnetic pole, thereby increasing the stretching margin and to reduce the influence of magnetic bubbles existing in the vicinity of the detection part other than a to-be-detected magnetic bubble on the detection part 3.

Figure 3:
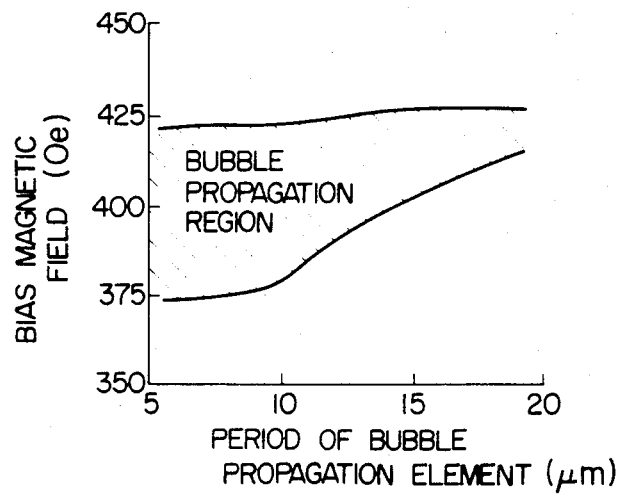
FIG. 3 is a graph showing a relation between the period of bubble propagation element at the stretcher part shown in FIG. 1 and a range of bias magnetic field in which a magnetic bubble can be propagated.
Figure 4:
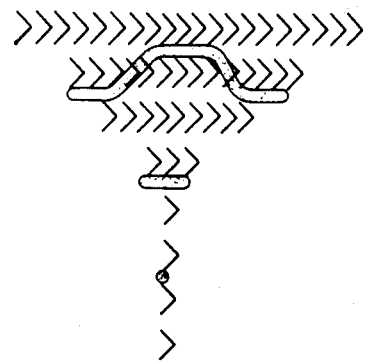
FIG. 4 is a schematic view showing that a magnetic bubble is stretched in a curved form when propagated through the stretcher part shown in FIG. 1.

FIG. 3 shows a relation between the period of bubble propagation element at the stretcher part and a range of bias magnetic field in which a magnetic bubble can be propagated, in the case where magnetic bubbles having a diameter of 1 μm are used by way of example. As is apparent from FIG. 3, when the period of the bubble propagation element is large, the range of bias magnetic field allowing the propagation of a magnetic bubble is narrow, that is, the bubble propagation margin decreases. In more detail, in the case where the period of the bubble propagation element at the sector portion forming the entrance of the stretcher part is made too large, a magnetic bubble passing through the sector portion is stretched in a curved form as shown in FIG. 4, when the bias magnetic field is low. Thus, the bubble propagation margin (namely, the allowable range of bias magnetic field) is reduced. Accordingly, it causes a decrease in bubble propagation margin to make large the period of the bubble propagation element uniformly at the stretcher part.

Figure 7:
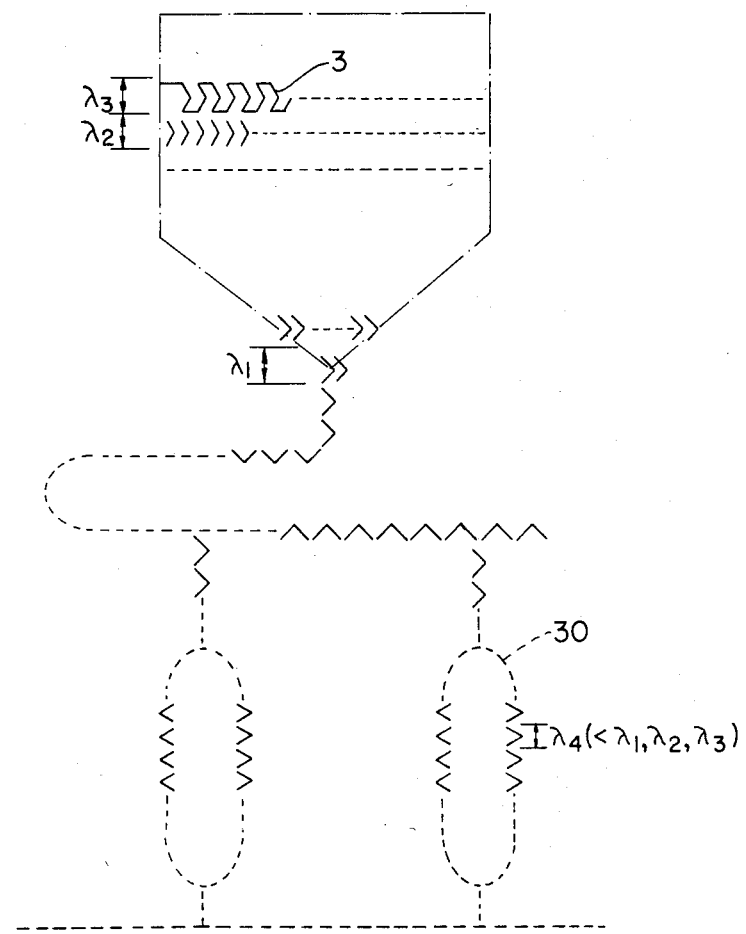
FIG. 7 is a schematic view showing the structure of a bubble memory device having a bubble detection part and information storage parts.

In view of the above-mentioned problem, according to the present invention, the period $\lambda_1$ of the bubble propagation element at the entrance of the stretcher part is selected so as to obtain an excellent bubble propagation characteristic, and the period $\lambda_2$ of the bubble propagation element at that portion of the stretcher part which is proximate to the detection part, is made larger than the period $\lambda_1$, to reduce the influence of magnetic bubbles proximate to a to-be-detected magnetic bubble on the detection part. Further, the influence of magnetic bubbles other than the to-be-detected magnetic bubble on the detection part can be effectively reduced by making the period $\lambda_3$ of bubble propagation element at the detection part 3 larger than the period $\lambda_1$. As shown in FIG. 7, each of the periods $\lambda_1$, $\lambda_2$ and $\lambda_3$ of the arrangement of the bubble propagation elements forming the detection part 3 is larger than the period $\lambda_4$ of the arrangement of the bubble propagation elements forming an information storage part 30. The period $\lambda_1$ at the entrance of the stretcher part may increase continuously or stepwise to the period $\lambda_2$ at the portion proximate to the detection part.

Now, the embodiments of the present invention will be explained below.

EMBODIMENT 1

Figure 5:
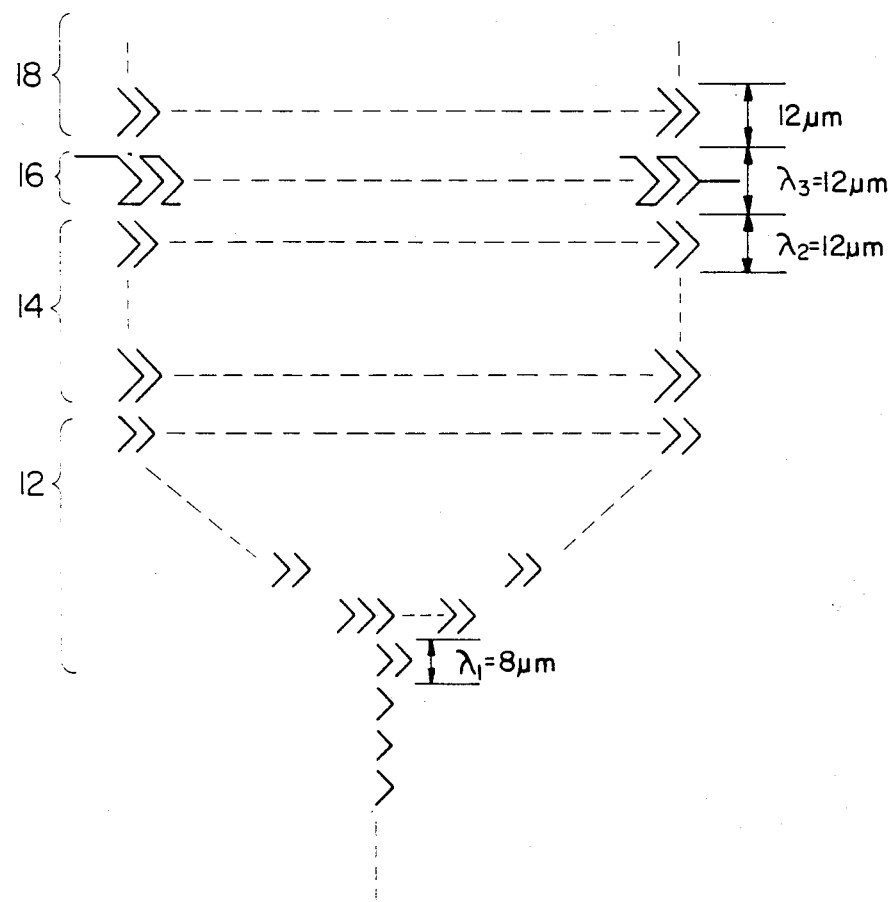
FIG. 5 is a schematic view showing the structure of a magnetic bubble detector according to a first embodiment of the present invention.

FIG. 5 shows the structure of a magnetic bubble detector according to a first embodiment of the present invention. When the magnetic bubble detector shown in FIG. 5 was used in a magnetic bubble device where fundamental bubble propagation elements for forming a minor loop were arranged with a period of 4 μm, the dimensions of the detector were selected as follows. That is, the period of the bubble propagation element at a portion 12 including the first to fifteenth rows of a stretcher part was made equal to 8 μm. Further, the number of bubble propagation elements included in each row was made smallest at the first row, and was gradually increased so that a magnetic bubble was stretched to 800 μm at the fifteenth row. The length of the sixteenth and following rows (a portion 14) was made equal to that on the fifteenth row, and therefore the length of the magnetic bubble was kept at 800 μm. However, the period of the bubble propagation element at a portion 14 including the sixteenth to twenty fourth rows of the stretcher part was made equal to 12 μm. Further, the period of the bubble propagation element at a portion 16 forming a detection part and a portion 18 forming a send-out part was also made equal to 12 μm. When a magnetic bubble having a diameter of 1 μm was detected by the above detector, favorable results were obtained. The detection-output change due to variations in distribution of magnetic bubbles on a propagation path was 0.8 mV in the case where the period of the bubble propagation element was made equal to 8 μm through the stretcher part, but was only 0.3 mV when the above detector was used. Further, the bubble propagation margin was only 7% in the case where the period of the bubble propagation element was made equal to 12 μm throughout the stretcher part, and was increased to 12% when the above detector was used.

Although, in the present embodiment, the period of the bubble propagation element is kept constant in the portions 12 and 14, respectively, the period of the bubble propagation element may be increased stepwise in the portion 12 or 14. Further, in the present embodiment, the period of the bubble propagation element at that portion of the stretcher part which is proximate to the detection part is made equal to the period of the bubble propagation element at the detection part. However, it is not always required to make the above portion of the stretcher part equal in the period of bubble propagation element to the detection part.

EMBODIMENT 2

Figure 6:
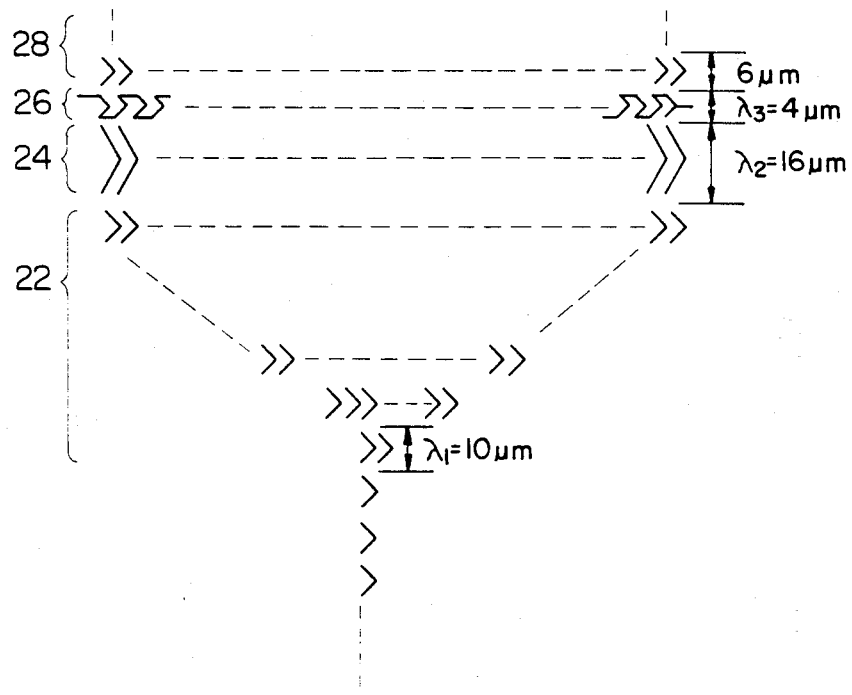
FIG. 6 is a schematic view showing the structure of a magnetic bubble detector according to a second embodiment of the present invention.

FIG. 6 shows the structure of a magnetic bubble detector according to a second embodiment of the present invention.

When the magnetic bubble detector shown in FIG. 6 was used in a magnetic bubble device where fundamental bubble propagation elements for forming a minor loop were arranged with a period of 4 μm, the dimensions of the detector was made as follows. That is, the period of bubble propagation element at a portion 22 including the first to twentieth rows of a stretcher part was made equal to 10 μm. The number of bubble propagation elements included in each row was made smallest at the first row, and was gradually increased so that a magnetic bubble was stretched to 1000 μm at the twentieth row. The number of bubble propagation elements on the twenty-first row (that is, at a portion 24) was made equal to that on the twentieth row, but the period of the bubble propagation element at the portion 24 was made equal to 16 μm. A detection line 26 for forming a detection part was provided on the twenty-second row. The period of the bubble propagation element was made equal to 4 μm at the detection part 26, and made equal to 6 μm throughout a send-out part 28.

When the above detector was used, the detection-output change due to variations in distribution of magnetic bubbles on a propagation path was only 0.4 mV, and the bias field margin was excellent, that is, 13%.

I claim:

1. A magnetic bubble detector having a stretcher part for stretching a magnetic bubble while propagating said magnetic bubble and a detection part for detecting said magnetic bubble while propagating said magnetic bubble, wherein the period of arrangement of bubble propagation elements forming the exit of said stretcher part viewed in a bubble propagation direction is made larger than the period of arrangement of bubble propagation elements forming the entrance of said stretcher part viewed in a bubble propagation direction.

2. A magnetic bubble detector according to claim 1, wherein the period of arrangement of bubble propagation elements forming said detection part viewed in a bubble propagation direction is larger than the period of arrangement of bubble propagation elements forming an information storage part viewed in a bubble propagation direction.

3. A magnetic bubble detector according to claim 1, wherein the period of arrangement of bubble propagation elements viewed in a bubble propagation direction takes a small value at said entrance of said stretcher part, and increases stepwise between said entrance and exit of said stretcher part.

4. A magnetic bubble detector according to claim 1, wherein said stretcher part includes a portion where the number of bubble propagation elements arranged in a direction perpendicular to a bubble propagation direction increases along said bubble propagation direction and a succeeding portion where the number of bubble propagation elements arranged in a direction perpendicular to a bubble propagation direction is kept constant along said bubble propagation direction, and the period of arrangement of bubble propagation elements forming said succeeding portion viewed in a bubble propagation direction is larger than the period of arrangement of bubble propagation elements forming said bubble-propagation-element increasing portion viewed in a bubble propagation direction.

5. A magnetic bubble detector according to claim 4, wherein said period of arrangement of bubble propagation elements forming said succeeding portion viewed in a bubble propagation direction increases stepwise in said succeeding portion.

6. A magnetic bubble detector according to claim 4, wherein said period of arrangement of bubble propagation elements forming said bubble-propagation-element increasing portion viewed in a bubble propagation direction increases stepwise in said bubble-propagation-element increasing portion.

7. A magnetic bubble detector according to claim 1, wherein the period of arrangement of bubble propagation elements forming said detection part viewed in a bubble propagation direction is smaller than the period of arrangement of bubble propagation elements forming a portion of said stretcher part which is proximate to said detection part, viewed in a bubble propagation direction.

* * * * *